(12) United States Patent
Nakanishi et al.

(10) Patent No.: US 8,072,413 B2
(45) Date of Patent: Dec. 6, 2011

(54) DISPLAY DEVICE, DISPLAY CONTROL METHOD AND ELECTRONIC EQUIPMENT

(75) Inventors: Takayuki Nakanishi, Kanagawa (JP); Yoshiharu Nakajima, Kanagawa (JP)

(73) Assignee: Sony Corporation, Tokyo (JP)

( * ) Notice: Subject to any disclaimer, the term of this patent is extended or adjusted under 35 U.S.C. 154(b) by 622 days.

(21) Appl. No.: 12/260,827

(22) Filed: Oct. 29, 2008

(65) Prior Publication Data

US 2009/0115802 A1 May 7, 2009

(30) Foreign Application Priority Data

Nov. 2, 2007 (JP) ................. 2007-286444

(51) Int. Cl.
G09G 3/36 (2006.01)
G09G 3/30 (2006.01)
G09G 3/32 (2006.01)
(52) U.S. Cl. ............... 345/102; 345/77; 345/81
(58) Field of Classification Search .......... 345/102, 345/690, 77, 81
See application file for complete search history.

(56) References Cited

U.S. PATENT DOCUMENTS

| 2005/0269487 A1* | 12/2005 | Ozawa ................. 250/214 R |
| 2007/0109239 A1* | 5/2007 | den Boer et al. .............. 345/87 |
| 2008/0079860 A1* | 4/2008 | Kunimori et al. ............. 349/43 |
| 2008/0094347 A1* | 4/2008 | Lee et al. ..................... 345/102 |
| 2008/0173796 A1* | 7/2008 | Lum et al. ................ 250/214 AL |
| 2010/0141623 A1* | 6/2010 | Nakanishi et al. ........... 345/207 |

FOREIGN PATENT DOCUMENTS

JP 2006 106294 4/2006

* cited by examiner

Primary Examiner — Amare Mengistu
Assistant Examiner — Sarvesh J Nadkarni
(74) Attorney, Agent, or Firm — K&L Gates LLP

(57) ABSTRACT

A display device includes: a first detection section configured to detect the light intensity around a display area; a second detection section configured to detect the dark current when light is shielded; and a comparator configured to compare the difference output between the first and second detection section against a given reference value. The display device controls the light intensity supplied to the display area according to the comparison result of the comparator.

4 Claims, 11 Drawing Sheets

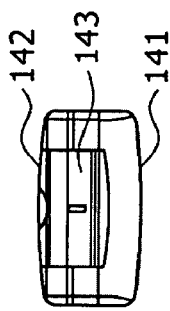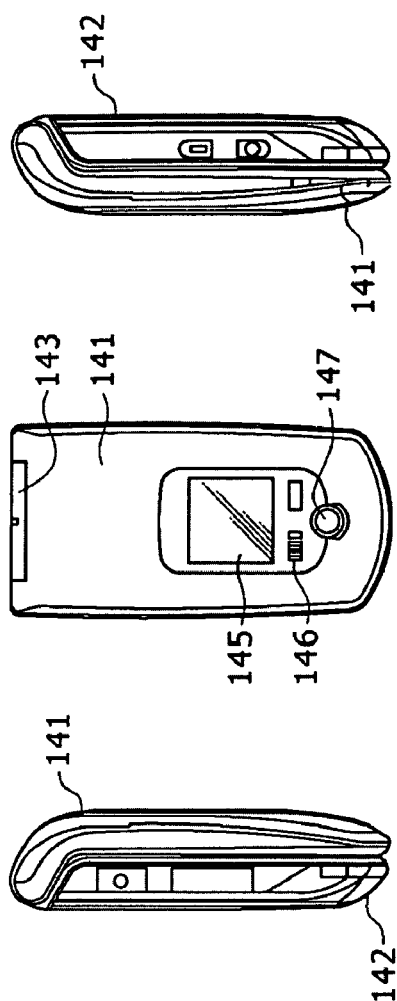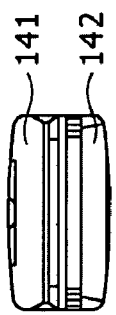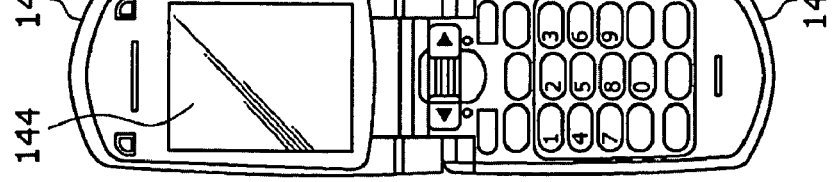

DISPLAY DEVICE, DISPLAY CONTROL METHOD AND ELECTRONIC EQUIPMENT

CROSS REFERENCES TO RELATED APPLICATIONS

The present application claims priority to Japanese Patent Application JP 2007-286444 filed with the Japan Patent Office on Nov. 2, 2007, the entire contents of which being incorporated herein by reference.

BACKGROUND

The present application relates to a display device for displaying a given picture, a display control method for controlling the same and electronic equipment using the same.

A known thin-film transistor (TFT) panel used in a liquid crystal display device for controlling the brightness of the backlight includes photosensors formed in the panel. Such a display device controls the backlight brightness according to the light intensity detected by the photosensors.

On the other hand, new configurations have been devised to eliminate the dark current from photosensor elements in the display device having photosensors formed therein. In one example of such configurations, two photosensors, i.e., one a brightness control sensor and another a light-shielding sensor, are connected in series so that the difference in light intensity between the two sensors is output. In another possible configuration, a plurality of light-shielding photosensors are connected in parallel to allow for selection of some sensors therefrom so that the variation in characteristics between the photosensor elements can be cancelled. This allows for the element size of the photosensors to be changed (refer to FIG. 16). Also refer to Japanese Patent Laid-open No. 2006-106294.

SUMMARY

However, although the variation between the brightness control and light-shielding photosensors can be accommodated by changing the preset photosensor element size, the closer the photosensor element size is to the optimal one, the smaller the difference in dark current flow between the brightness control and light-shielding photosensors. As a result, a large amount of time is required to determine, based on the difference output, whether the element size is optimal. This makes it impossible to quickly adjust the photosensor element size to be optimal.

The present application has been devised to solve the above problem. That is, in carrying out the present application and according to one embodiment thereof, there is provided a display device which includes a first and second detection section and a comparator. The first detection section detects the light intensity around the display area. The second detection section detects the dark current when light is shielded. The comparator compares the difference output between the first and second detection section against a reference value. The display device controls the light intensity supplied to the display area according to the comparison result of the comparator. The first or second detection section has a plurality of detection elements connected in parallel so as to be selectable. Two signals, i.e., a polarity signal adapted to select the polarity of the difference output and a reference value selection signal adapted to select the polarity of the given reference value, are fed to the comparator. First and second choices are set by the selection of the plurality of detection elements making up the first or second detection section. The first choice translates into a smaller amount of dark current in the second detection section than in the first detection section. The second choice translates into a larger amount of dark current in the second detection section than in the first detection section. The polarity signal and the reference value selection signal are fed to the comparator so that the polarities of the difference output and the given reference value fed to the comparator are opposite between the first and second choices. The plurality of detection elements making up the first or second detection section are selected, based on the comparison results of the comparator in the two polarities set for the first and second choices, so that the amount of dark current is the same in the first and second detection sections.

In the embodiment configured as described above, the comparator is fed with the polarity signal adapted to select the polarity of the difference output and the reference value selection signal adapted to select the polarity of the given reference value. In order to select the plurality of detection elements for the first or second detection section according to the element size of the second or first detection section, therefore, two cases are selected, one in which the element size is smaller than that of the first or second detection section and another in which the element size is larger. This makes it possible to reverse in polarity the difference output and given reference value fed to the comparator between the two cases. As a result, even if the detected amounts of dark current in the two cases are opposite in sign (positive or negative), the element size of the first or second detection section can be optimized with the polarities of the comparison results matching each other.

Further, in carrying out the present application and according to another embodiment thereof, there is provided a display control method for a display device including a first detection section configured to detect the light intensity around a display area, a second detection section configured to detect the dark current when light is shielded, and a comparator configured to compare the difference output between the first and second detection section against a given reference value, the first or second detection section having a plurality of detection elements connected in parallel so as to be selectable. The display control method includes the steps of: controlling the light intensity supplied to the display area according to the comparison result of the comparator; and feeding a polarity signal adapted to select the polarity of the difference output and a reference value selection signal adapted to select the polarity of the given reference value to the comparator. The method further includes the step of setting first and second choices by the selection of the plurality of detection elements making up the first or second detection section, the first choice translating into a smaller amount of dark current in the second detection section than in the first detection section, the second choice translating into a larger amount of dark current in the second detection section than in the first detection section. The method further includes the steps of: feeding the polarity signal and the reference value selection signal to the comparator so that the polarities of the difference output and the given reference value fed to the comparator are opposite between the first and second choices; and selecting the plurality of detection elements making up the first or second detection section, based on the comparison results of the comparator in the two polarities set for the first and second choices, so that the amount of dark current is the same in the first and second detection section.

In the embodiment configured as described above, in order to select the plurality of detection elements for the first or second detection section according to the element size of the second or first detection section, two cases are selected, one in which the element size is smaller than that of the first or second detection section and another in which the element size is larger. This makes it possible to reverse in polarity the difference output and given reference value fed to the comparator between the two cases. As a result, even if the detected amounts of dark current in the two cases are opposite in sign, the element size of the first or second detection section can be optimized with the polarities of the comparison results matching each other.

More specifically, two element sizes are determined by two choices of the plurality of detection elements making up the first or second detection section so that the comparison results of the comparator with the first and second choices are equal to each other. Next, the plurality of detection elements making up the first or second detection section are selected so that the element size is closest to the average of the two element sizes. Finally, the light intensity supplied to the display area is controlled according to the comparison result of the difference output between the first and second detection sections against a reference value based on the selection of the plurality of detection elements.

Still further, in carrying out the present application and according to still another embodiment thereof, there is provided electronic equipment having a display device in its enclosure. The display device includes first and second detection sections and a comparator. The first detection section detects the light intensity around the display area. The second detection section detects the dark current when light is shielded. The comparator compares the difference output between the first and second detection sections against a reference value. The display device controls the light intensity supplied to the display area according to the comparison result of the comparator. The first or second detection section has a plurality of detection elements connected in parallel so as to be selectable. Two signals, i.e., a polarity signal adapted to select the polarity of the difference output and a reference value selection signal adapted to select the polarity of the given reference value, are fed to the comparator. First and second choices are set by the selection of the plurality of detection elements making up the first or second detection section. The first choice translates into a smaller amount of dark current in the second detection section than in the first detection section. The second choice translates into a larger amount of dark current in the second detection section than in the first detection section. The polarity signal and the reference value selection signal are fed to the comparator so that the polarities of the difference output and the given reference value fed to the comparator are opposite between the first and second choices. The plurality of detection elements making up the first or second detection section are selected, based on the comparison results of the comparator in the two polarities set for the first and second choices, so that the amount of dark current is the same in the first and second detection sections.

In the embodiment configured as described above, the comparator is fed with the polarity signal adapted to select the polarity of the difference output and the reference value selection signal adapted to select the polarity of the given reference value. In order to select the plurality of detection elements for the first or second detection section according to the element size of the second or first detection section, therefore, two cases are selected, one in which the element size is smaller than that of the first or second detection section and another in which the element size is larger. This makes it possible to reverse in polarity the difference output and given reference value fed to the comparator between the two cases. As a result, even if the detected amounts of dark current in the two cases are opposite in sign, the element size of the first or second detection section can be optimized with the polarities of the comparison results matching each other.

Therefore, the present application allows for quick detection of an optimal element size required to correct the manufacturing variation in a light intensity detection section formed on the substrate of the display device, thus providing reduction in time required to adjust the element size to be optimal.

Additional features and advantages are described herein, and will be apparent from the following Detailed Description and the figures.

BRIEF DESCRIPTION OF THE FIGURES

FIGS. 10A to 10G are views illustrating a mobile terminal device such as mobile phone to which the present embodiment is applied;

DETAILED DESCRIPTION

An embodiment will be described below with reference to the accompanying drawings.

<Outline of the Display Device>

Figure 1:
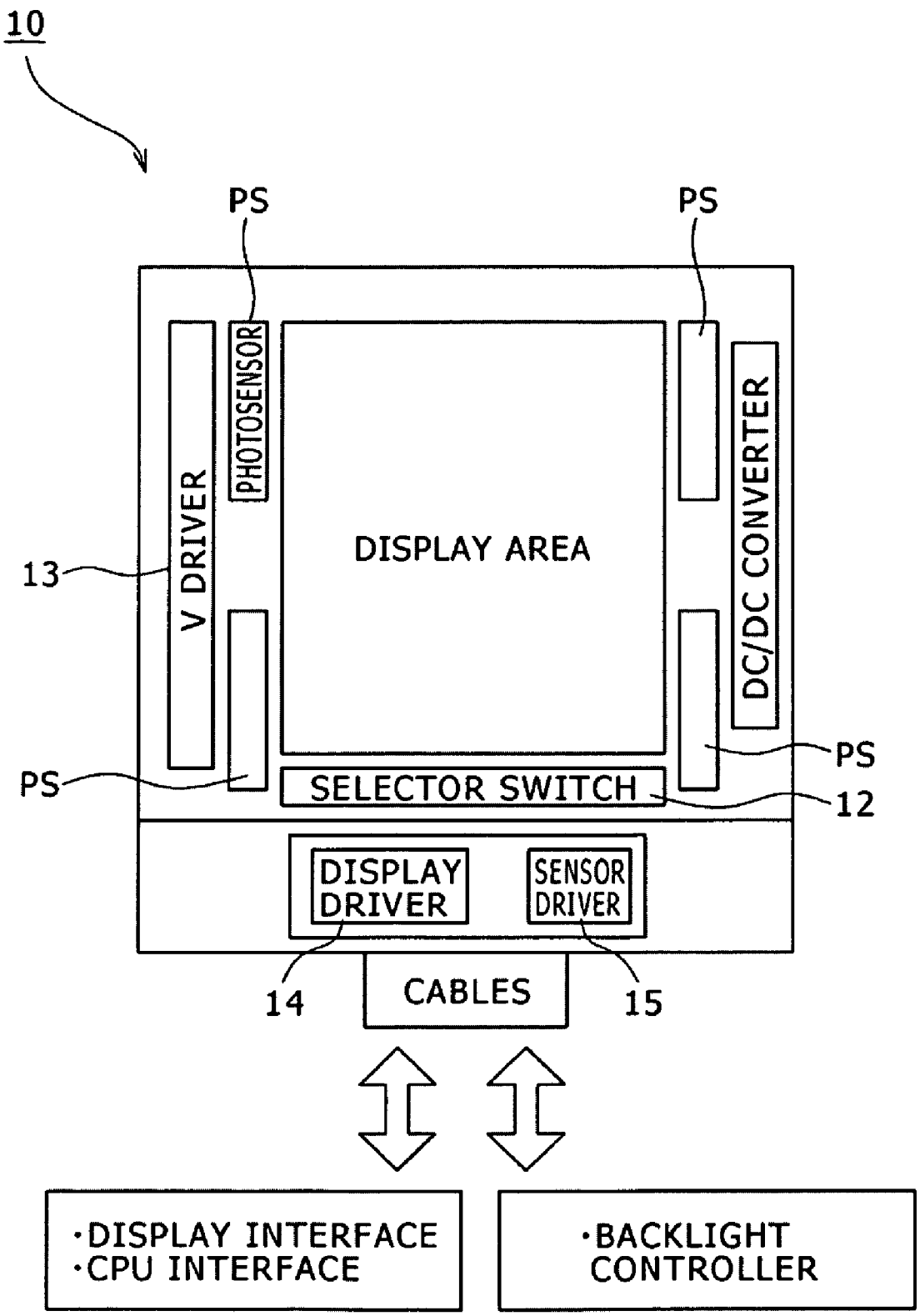
FIG. 1 is a schematic diagram of a display device according to a present embodiment.

FIG. 1 is a schematic diagram of a display device according to a present embodiment. That is, the display device according to the present application, i.e., a display panel 10, includes a display area (sensor area) 11 and selector switch 12 adapted to perform a horizontal scan for display. The display panel 10 further includes a V driver 13 adapted to perform a vertical scan for display, a display driver 14, a sensor driver 15 and photosensors PS. The photosensors PS are the major components of a plurality of detection section.

The display area (sensor area) 11 modulates light from an unshown backlight to emit display light. The plurality of photosensors PS are provided around the display area 11 and driven by the sensor driver 15. The display driver 14 and sensor driver 15 are available in an integrated circuit form and mounted on the substrate as a chip component.

The selector switch 12 line-sequentially drives the liquid crystal elements of the pixels in the display area 11 together with the V driver 13, based on the display signal for display drive and control clock supplied from the display driver 14.

The plurality of photosensors PS are provided around the display area 11. The photosensors PS include diodes or transistors and are formed, for example, on the same substrate as drive elements formed in the display area 11.

The display panel 10 is connected to external interfaces (e.g., display interface and CPU interface) and backlight controller by means of cables. The same panel 10 is driven by control and video signals supplied therefrom.

Although the four photosensors PS are provided beside the four corners of the display area 11 in the example illustrated in FIG. 1, it is only necessary to provide at least two photosensors. In this case, one of the photosensors serves as a first photosensor adapted to detect the light intensity around the display area 11, and the other as a second photosensor adapted to detect the dark current when light is blocked. In the present embodiment, the control section (backlight controller) controls the light intensity of the backlight based on the detection results of these photosensors. Specific application examples of these two photosensors will be described below.

<Photosensor Configuration>

Figure 2:
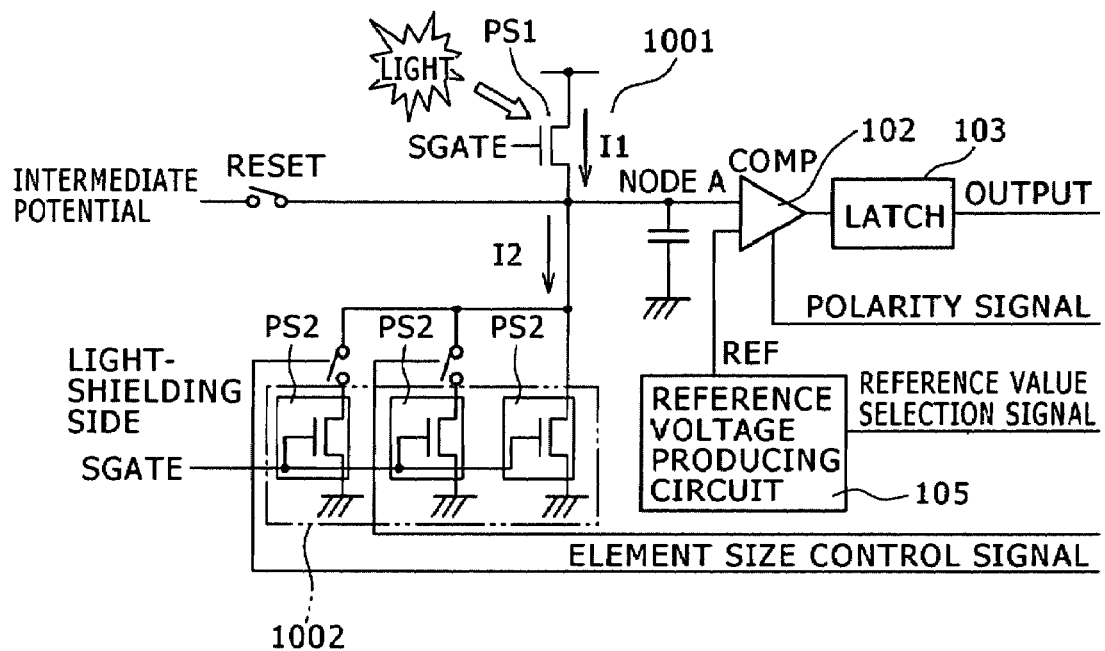
FIG. 2 is a circuit diagram describing major components of the display device according to the present embodiment.

FIG. 2 is a circuit diagram describing major components of the display device according to the present embodiment. That is, the display device according to the present embodiment includes first and second detection sections 1001 and 1002, a comparator 102 and a latch 103. The first detection section 1001 detects the light intensity around the display area. The second detection section detects the dark current when light is blocked. The comparator 102 compares the difference output between the first and second detection sections 1001 and 1002 against a given reference value. The latch 103 holds the comparison result of the comparator 102. The light intensity supplied to the display area (light intensity of the backlight) is controlled according to the comparison result of the comparator 102.

In this configuration, the first detection section 1001 includes a single photosensor PS1, and the second detection section 1002 includes a plurality of photosensors PS2 connected in parallel. Some can be selected from the plurality of photosensors PS2 through switch control.

The second detection section 1002 includes the plurality of photosensors PS2 connected in parallel. As a result, use of some of the photosensors PS2 determines the element size of the detection section.

The element size of the detection section can be determined by an element size control signal supplied from external equipment. The same control signal determines which switch is to be closed. The element size can be presented in a numerical form by conversion using the gate length of the single photosensor PS2. The element size can be determined by multiplying the number of the photosensors PS2 connected in parallel by the gate length.

Further, the comparator 102 is fed with a polarity signal and a given reference value ref. The polarity signal selects the polarity of the difference output between the first and second detection sections 1001 and 1002.

The polarity signal fed to the comparator 102 determines the sign (positive or negative) of the comparison result between the given reference value ref and input signal. In the present embodiment, the comparison result is controlled to have the same polarity, regardless of whether the input signal (difference output from the detection section) is positive or negative.

The reference value selection signal is fed to a reference voltage generating circuit 105. The same signal is used to select a reference voltage of opposite polarity or another reference voltage. In FIG. 2, the same signal selects the polarity of a given reference value ref.

In the present embodiment configured as described above, the polarity signal and reference value selection signal are supplied so that the polarities of the difference output and given reference value fed to the comparator 102 are opposite between when the amount of dark current in the second detection section 1002 is larger than that in the first detection section 1001 and when the amount of dark current in the second detection section 1002 is smaller than that in the first detection section 1001 by the selection of the plurality of photosensors PS2 making up the second detection section 1002. The plurality of photosensors PS2 making up the second detection section 1002 are selected, based on the comparison results of the comparator 102 in the two polarities, so that the amount of dark current in the first detection section 1001 is the same as that in the second detection section 1002.

This permits quick selection of the plurality of photosensors PS2 making up the second detection section 1002, based on the comparison results of the comparator 102 in the two polarities, namely, quick determination of the optimal element size.

<Determination Method of the Optimal Element Size of the Second Detection Section>

We consider the case in which the first and second detection sections 1001 and 1002 are connected in series so that the difference in current resulting from the light intensity detection is compared by the comparator 102 as in the above configuration. If the second detection section 1002 includes the plurality of photosensors PS2 which are selectable, the plurality of photosensors PS2 (optimal element size) of the second detection section 1002 are selected so that the amount of dark current is the same in the first and second detection sections 1001 and 1002. This provides a light intensity detection result free from the manufacturing variations of the first and second detection sections 1001 and 1002 through cancellation.

Here, the optimal element size of the second detection section has been heretofore determined as follows. That is, while the dark current is measured for the first and second detection sections 1001 and 1002, the photosensors PS2 are added or removed, one at a time, to or from the plurality thereof making up the second detection section 1002 to find the point where the difference output is the smallest. However, with this method, the closer the element size to the optimal one, the smaller the difference output becomes. As a result, considerable time is required before the comparator 102 produces a comparison result.

For this reason, the present embodiment permits quick determination of the optimal element size by the following method. First, an element size control signal is transmitted so that only a few of the photosensors PS2 are selected to make up the second detection section 1002 (a small element size is selected). When a small element size is selected for the second detection section 1002, the element size of the second detection section 1002 is set smaller than that of the first detection section 1001 (first choice). This provides a smaller amount of dark current in the second detection section 1002 than in the first detection section 1001.

Next, a polarity signal is transmitted to the comparator 102 so that the polarity of the comparator 102 is positive, that is, the comparator 102 produces a positive comparison result when the input signal exceeds the reference value. Further, the reference value ref fed to the comparator 102 is set positive by the reference value selection signal fed to the reference voltage generating circuit 105.

Next, the dark current detection is conducted by the first and second detection sections 1001 and 1002 in this condition. The element size of the second detection section 1002 is smaller than that of the first detection section 1001 because of the above setup. As a result, the difference output in dark current is sufficiently large.

Figure 3:
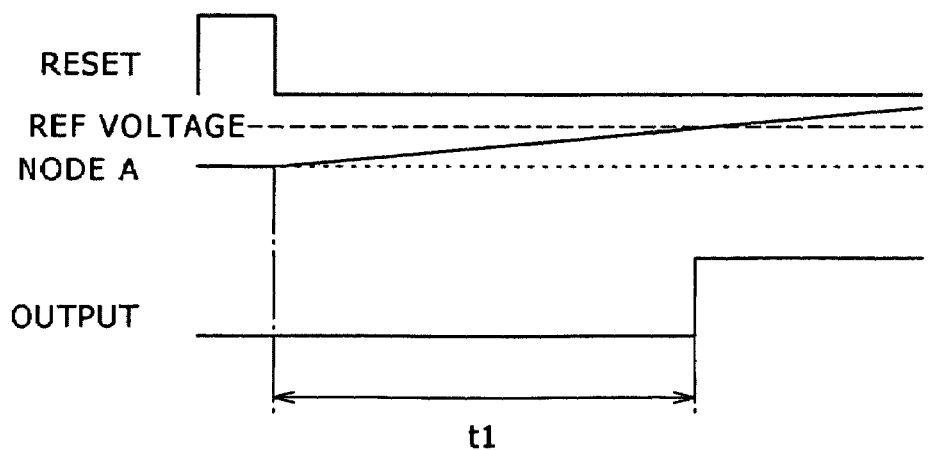
FIG. 3 is a timing diagram illustrating a difference output and comparator output when the element size of a second detection section is smaller than that of a first detection section.

FIG. 3 is a timing diagram illustrating the difference output and comparator output when the element size of the second detection section is smaller than that of the first detection section. That is, the dark current detection begins when the reset is switched ON and OFF. Because the element size of the second detection section 1002 shown in FIG. 2 is smaller than that of the first detection section 1001, the amount of dark current in the first detection section 1001 (I1) is larger than that in the second detection section 1002 (I2). As a result, an input node A (difference output between the two detection sections) to the comparator 102 increases positively with time.

With the above setup, the comparator 102 is set to positive polarity, and the given reference value ref is set positive. Therefore, when the node A value which increases positively with time exceeds the given positive reference value ref, the comparator 102 produces a comparison result indicating a reversal in polarity. Thus, because of the difference in element size between the first and second detection sections 1001 and 1002, a difference output appears even from the dark current measurement. As a result, the comparator 102 can produce, in a short period of time, an output indicating a reversal in polarity as a result of the node A value exceeding the reference value. Here, the amount of time required from when the reset is switched OFF to when the output of the comparator 102 becomes positive is assumed to be t1.

Next, an element size control signal is transmitted so that many of the photosensors PS2 are selected to make up the second detection section 1002 (a large element size is selected). When a large element size is selected for the second detection section 1002, the element size of the second detection section 1002 is set larger than that of the first detection section 1001 (second choice). This provides a larger amount of dark current in the second detection section 1002 than in the first detection section 1001.

Next, a polarity signal is transmitted to the comparator 102 so that the polarity of the comparator 102 is negative, that is, the comparator 102 produces a positive comparison result when the input signal falls below the reference value. Further, the reference value ref fed to the comparator 102 is set negative by the reference value selection signal fed to the reference voltage generating circuit 105.

Next, the dark current detection is conducted by the first and second detection sections 1001 and 1002 in this condition. The element size of the second detection section 1002 is larger than that of the first detection section 1001 because of the above setup. As a result, the difference output in dark current is sufficiently large.

Figure 4:
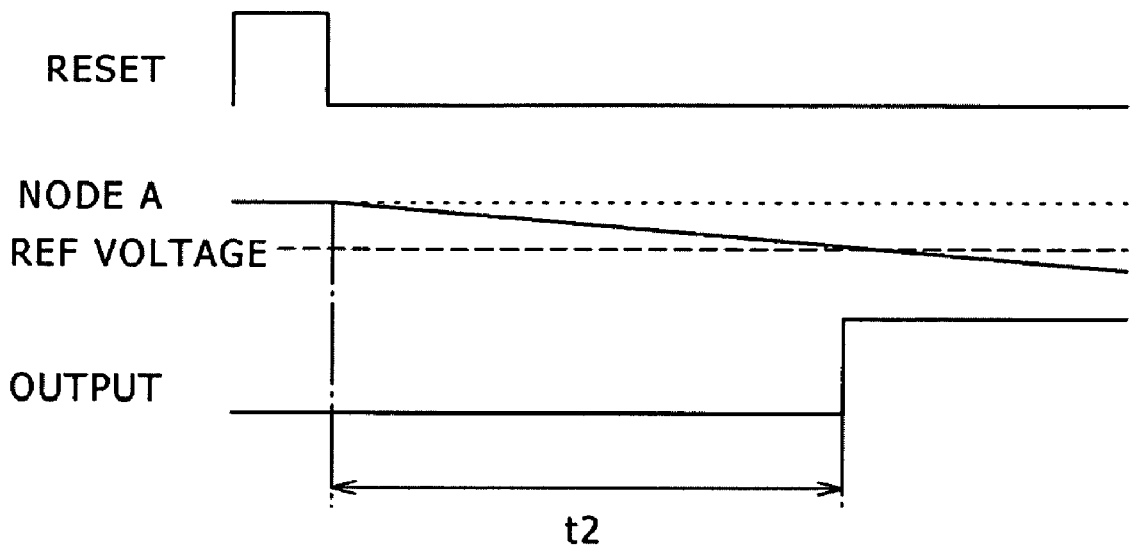
FIG. 4 is a timing diagram illustrating the difference output and comparator output when the element size of the second detection section is larger than that of the first detection section.

FIG. 4 is a timing diagram illustrating the difference output and comparator output when the element size of the second detection section is larger than that of the first detection section. That is, the dark current detection begins when the reset is switched ON and OFF. Because the element size of the second detection section 1002 shown in FIG. 2 is larger than that of the first detection section 1001, the amount of dark current in the first detection section 1001 (I1) is smaller than in the second detection section 1002 (I2). As a result, the input node A (difference output between the two detection sections) to the comparator 102 increases negatively with time.

With the above setup, the comparator 102 is set to negative polarity, and the given reference value ref is set negative. Therefore, when the node A value which increases negatively with time falls below the given negative reference value ref, the comparator 102 produces a comparison result indicating a reversal in polarity. Thus, because of the difference in element size between the first and second detection sections 1001 and 1002, a difference output appears even from the dark current measurement. As a result, the comparator 102 can produce, in a short period of time, an output indicating a reversal in polarity as a result of the node A value falling below the reference value. Here, the amount of time required from when the reset is switched OFF to when the output of the comparator 102 becomes positive is assumed to be t2.

Here, if the time t2 is different from the time t1, the number of the plurality of photosensors PS2 selected to make up the second detection section 1002 is changed to change the element size. More specifically, if the time t2 is shorter than the time t1, the number of the plurality of photosensors PS2 connected in parallel to make up the second detection section 1002 is reduced to reduce the element size of the second detection section 1002. Contrary to this, if the time t2 is longer than the time t1, the number of the plurality of photosensors PS2 connected in parallel to make up the second detection section 1002 is increased to increase the element size of the second detection section 1002. Thus, the element size of the second detection section 1002 (number of the plurality of photosensors PS2 selected) at that time is determined so that the time t2 is equal to the time t1, or so that the difference between the times t2 and t1 is the smallest.

Next, an intermediate element size is calculated between the element size of the second detection section 1002 when the time t1 was measured and the element size of the same section 1002 when the time t2 was measured to be equal to the time t1 (including the case in which the difference was the smallest). That is, the fact that the times t1 and t2 are equal to each other means that the larger difference in element size between the second and first detection sections 1002 and 1001 has been rendered equal to the smaller difference in element size between the two detection sections. Hence, the intermediate element size is the optimal size that provides a match between the element sizes of the second and first detection sections 1002 and 1001.

The times t1 and t2 are measured with a difference in element size provided between the first and second detection sections 1001 and 1002, thus producing a result in a short period of time. Further, the optimal element size can be quickly found by a simple calculation, namely, finding the intermediate size when the times t1 and t2 are equal to each other.

When the optimal element size of the second detection section 1002 is found, the number of the plurality of photosensors PS2 to be selected is determined. In the circuit diagram shown in FIG. 2, the second detection section 1002 include the three photosensors PS2 connected in parallel. However, if the same detection section 1002 include even more of the photosensors PS2 connected in parallel, a more elaborate selection (selection with finer pitches) will be possible.

Then, after the second detection section 1002 are set to the optimal element size, the light intensity around the display area is detected by the photosensor PS1 of the first detection section. At this time, the dark current is detected with the optimal element size set earlier because of a light-shielding film in the second detection section 1002. Therefore, the difference output appearing at the node A is the output obtained by subtracting the dark current in the second detection section 1002 (same as the dark current in the first detection section 1001) from the light intensity around the display area detected by the first detection section 1001. This difference output can be fed to the comparator 102.

The comparator 102 compares the given reference value and difference output to transfer a comparison result thereof to the backlight controller shown in FIG. 1. The backlight controller calculates the light intensity around the display area 11 from the comparison result to control the backlight light intensity according to the calculated light intensity. For example, the backlight controller controls the backlight so that the higher the light intensity around the display area 11, the more the backlight light intensity is increased, and the lower the light intensity around the display area 11, the more the backlight light intensity is reduced.

In the aforementioned embodiment, the second detection section 1002 include the plurality of photosensors PS2 connected in parallel, and the element size of the same section 1002 is determined by the number of photosensors PS2 used therein. However, the first detection section 1001 may include a plurality of photosensors connected in parallel, and the element size of the same section 1001 may be determined by the number of photosensors used therein.

<Electronic Equipment>

Figure 5:
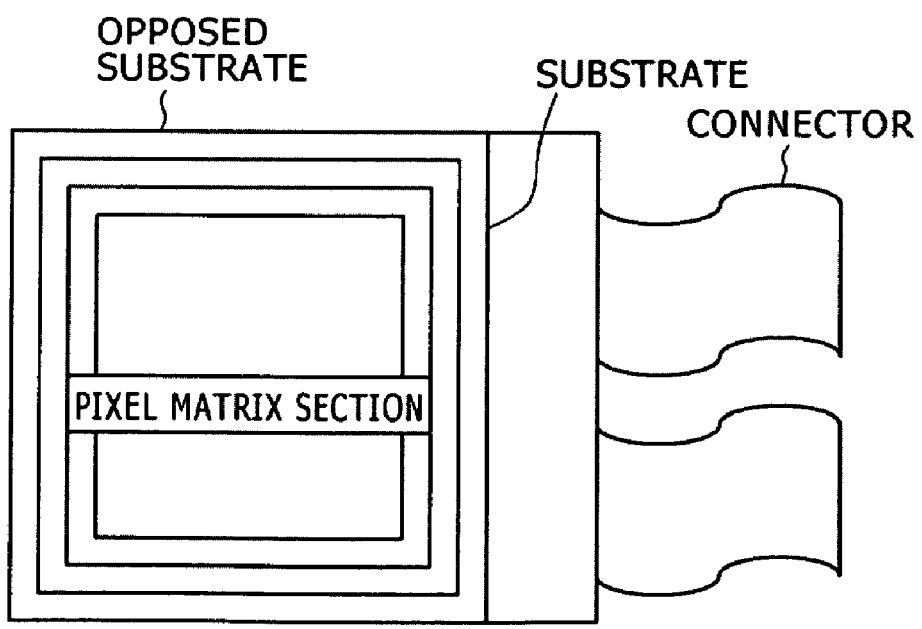
FIG. 5 is a schematic diagram illustrating an example of a flat display device in a modular form.

The display device according to an embodiment includes a flat display device in a modular form as illustrated in FIG. 5. For example, a pixel array section is provided on an insulating substrate. The pixel array section has pixels integrated and formed in a matrix. Each of the pixels includes a liquid crystal element, thin film transistors, thin film capacitors, light-receiving elements and other components. An adhesive is applied around the pixel array section, after which an opposed substrate made of glass or other material is attached for use as a display module. This transparent opposed substrate may have a color filter, a protective film, a light-shielding film and so on as necessary. An FPC (flexible printed circuit), adapted to allow exchange of signals or other information between external equipment and the pixel array section, may be provided as a connector on the display module.

The aforementioned display device according to the present embodiment is applicable as a display device of a wide range of electronic equipment including a digital camera, a laptop personal computer, a mobile terminal device such as a mobile phone and a video camcorder illustrated in FIGS. 6 to 10. These pieces of equipment are designed to display an image or video of a video signal fed to or generated inside the electronic equipment. Specific examples of electronic equipment, to which the present embodiment is applied, will be given below.

Figure 6:
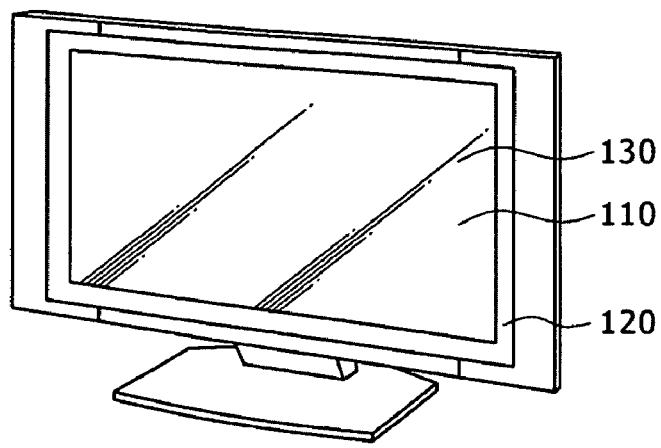
FIG. 6 is a perspective view illustrating a television set to which the present embodiment is applied.

FIG. 6 is a perspective view illustrating a television set to which the present embodiment is applied. The television set according to the present application example includes a video display screen section 110 made up, for example, of a front panel 120, filter glass 130 and other parts. The television set is manufactured by using the display device according to the present embodiment as the video display screen section 110.

Figure 7A:
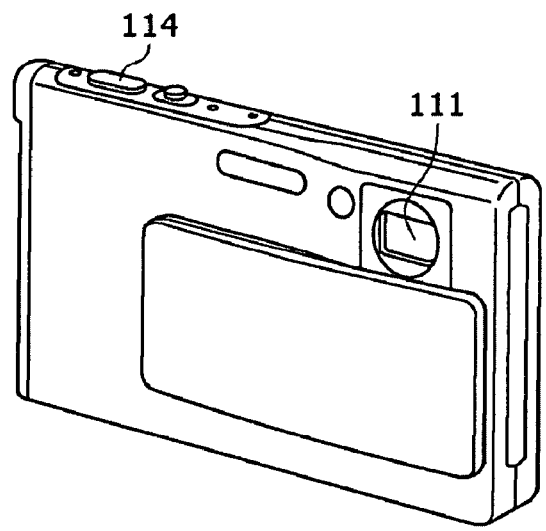
FIGS. 7A and 7B are perspective views illustrating a digital camera to which the present embodiment is applied.
Figure 7B:
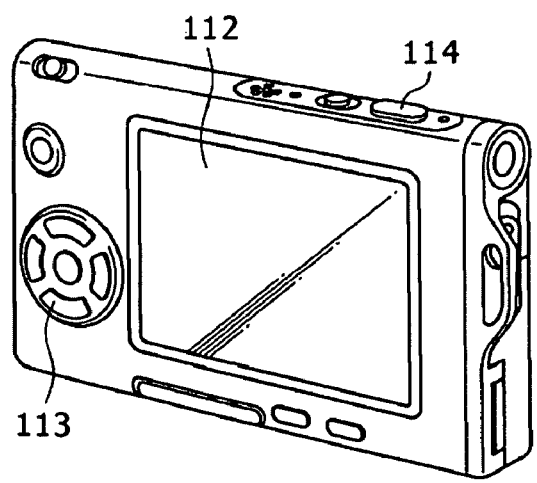

FIGS. 7A and 7B are views illustrating a digital camera to which the present embodiment is applied. FIG. 7A is a perspective view of the digital camera as seen from the front, and FIG. 7B is a perspective view thereof as seen from the rear. The digital camera according to the present application example includes a flash-emitting section 111, a display section 112, a menu switch 113, a shutter button 114 and other parts. The digital camera is manufactured by using the display device according to the present embodiment as the display section 112.

Figure 8:
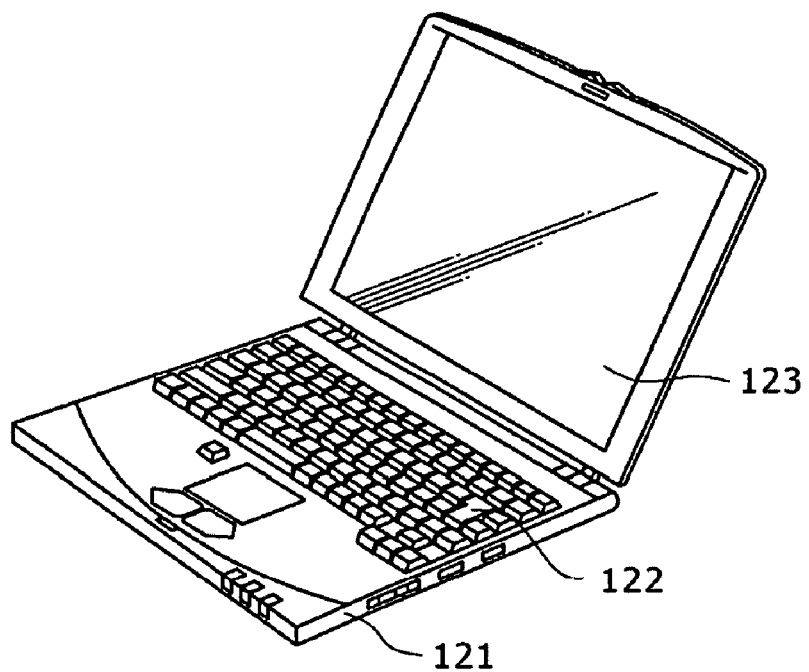
FIG. 8 is a perspective view illustrating a laptop personal computer to which the present embodiment is applied.

FIG. 8 is a perspective view illustrating a laptop personal computer to which the present embodiment is applied. The laptop personal computer according to the present application example includes, in a main body 121, a keyboard 122 adapted to be manipulated for entry of text or other information, a display section 123 adapted to display an image, and other parts. The laptop personal computer is manufactured by using the display device according to the present embodiment as the display section 123.

Figure 9:
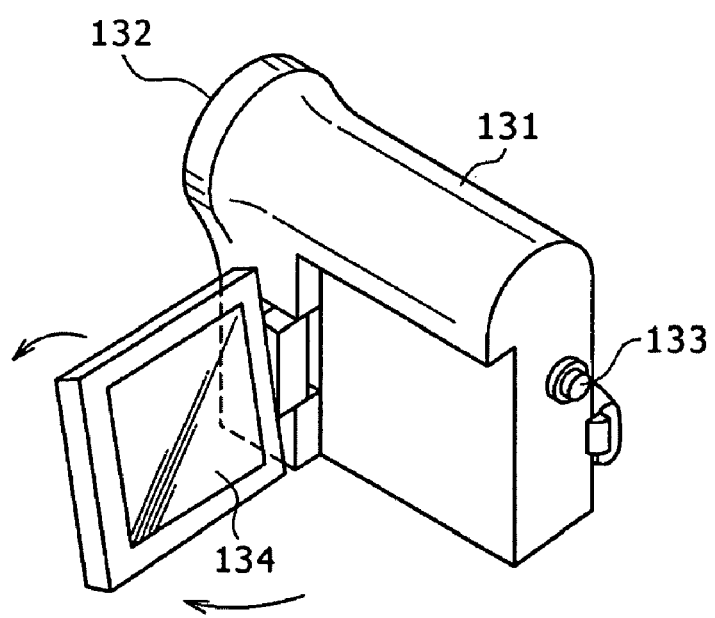
FIG. 9 is a perspective view illustrating a video camcorder to which the present embodiment is applied.

FIG. 9 is a perspective view illustrating a video camcorder to which the present embodiment is applied. The video camcorder according to the present application example includes a main body section 131, a lens 132 provided on the front-facing side surface to capture the image of the subject, an imaging start/stop switch 133, a display section 134 and other parts. The video camcorder is manufactured by using the display device according to the present embodiment as the display section 134.

FIGS. 10A to 10G are perspective views illustrating a mobile terminal device such as mobile phone to which the present embodiment is applied. FIG. 10A is a front view of the mobile phone in an open position. FIG. 10B is a side view thereof. FIG. 10C is a front view of the mobile phone in a closed position. FIG. 10D is a left side view. FIG. 10E is a right side view. FIG. 10F is a top view. FIG. 10G is a bottom view. The mobile phone according to the present application example includes an upper enclosure 141, a lower enclosure 142, a connecting section (hinge section in this example) 143, a display 144, a subdisplay 145, a picture light 146, a camera 147 and other parts. The mobile phone is manufactured by using the display device according to the present embodiment as the display 144 and the subdisplay 145.

<Display/Imaging Device>

Figure 11:
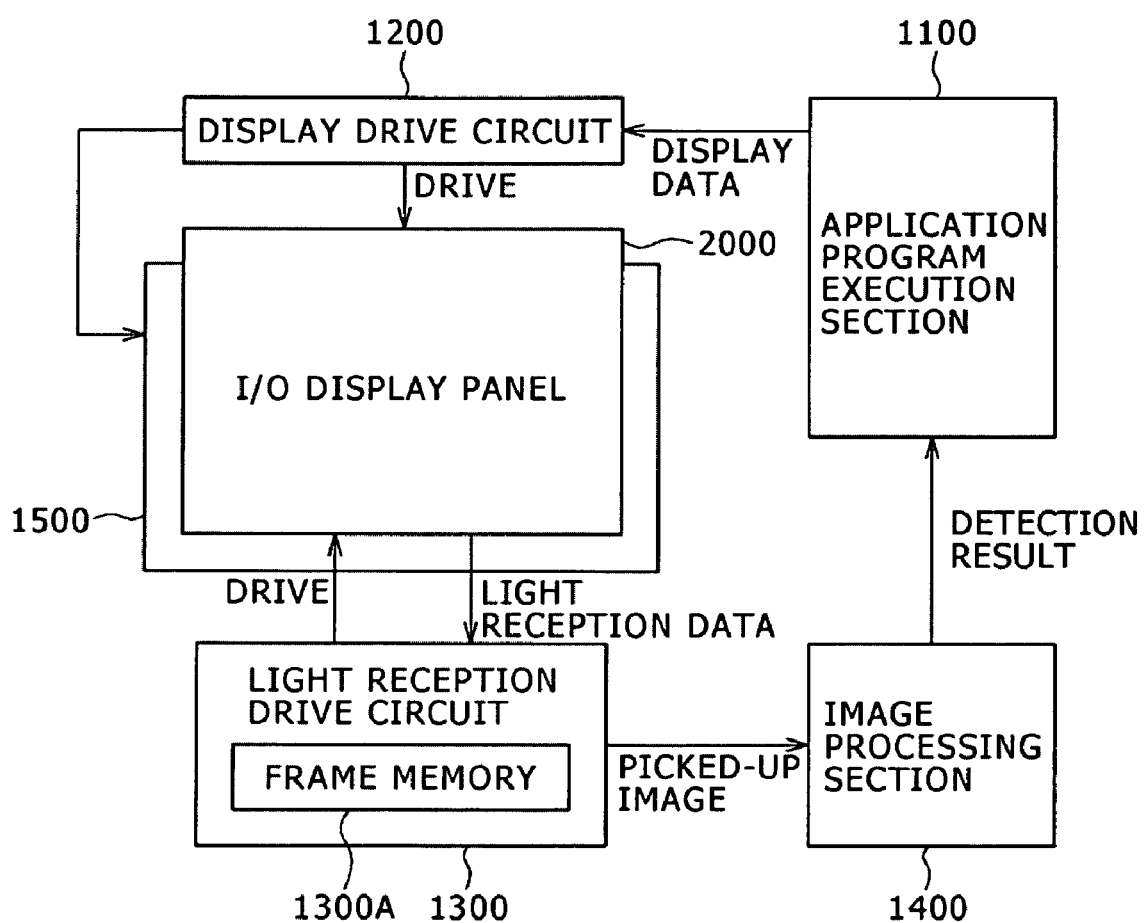
FIG. 11 is a block diagram illustrating the configuration of a display/imaging device according to a first embodiment.

The display device according to the present embodiment is applicable to a display/imaging device as described below. Further, this display/imaging device is applicable to a variety of electronic equipment described earlier. FIG. 11 illustrates the overall configuration of the display/imaging device. This display/imaging device includes an I/O display panel 2000, a backlight 1500, a display drive circuit 1200, a light reception drive circuit 1300, an image processing section 1400 and an application program execution section 1100.

The I/O display panel 2000 includes a liquid crystal panel (LCD (liquid crystal display)) having a plurality of pixels arranged in a matrix over the entire surface thereof. The same panel 2000 has the capabilities to not only display given images such as graphics and texts based on display data through line-sequential operation (display function) but also pickup the image of an object in contact with or proximity to the I/O display panel 2000 (imaging function). On the other hand, the backlight 1500 includes a plurality of light-emitting diodes arranged therein to serve as the light source of the I/O display panel 2000. The backlight 1500 is designed, for example, to turn ON and OFF at high speed at given timings in synchronism with the operation timing of the I/O display panel 2000, as described later.

The display drive circuit 1200 drives (line-sequentially drives) the I/O display panel 2000 so that an image is displayed on the same panel 2000 based on display data (so that the same panel 2000 displays an image).

The light reception drive circuit 1300 drives (line-sequentially drives) the I/O display panel 2000 so that the same panel 2000 receives light reception data (images an object). It should be noted that light reception data of each pixel is stored in a frame memory 1300A on a frame-by-frame basis and output to the image processing section 1400 as a picked-up image.

The image processing section 1400 performs given image processing (calculations) based on the picked-up image output from the light reception drive circuit 1300 to detect and obtain information (e.g., position coordinate data, shape and size of the object) about the object in contact with or proximity to the I/O display panel 2000. It should be noted that the detection will be described in detail later.

The application program execution section 1100 performs processing according to given application software based on the detection result of the image processing section 1400. An example of such processing includes the position coordinates of the detected object in the display data and displays the position coordinates on the I/O display panel 2000. It should be noted that the display data generated by the application program execution section 1100 is supplied to the display drive circuit 1200.

Figure 12:
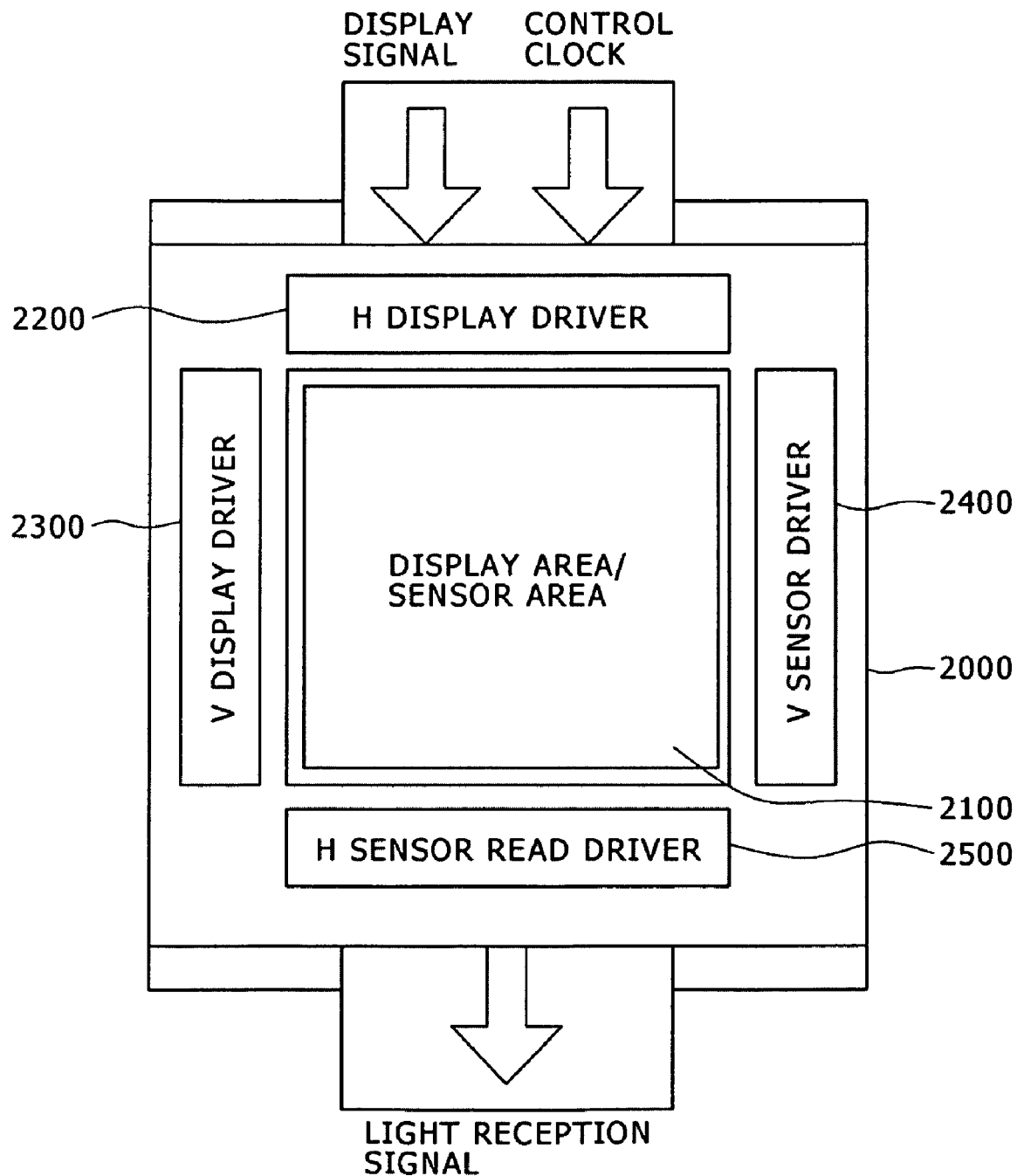
FIG. 12 is a block diagram illustrating a configuration example of an I/O display panel shown in FIG. 1.

Next, a detailed configuration example of the I/O display panel 2000 will be described with reference to FIG. 12. The I/O display panel 2000 includes a display area (sensor area) 2100, an H display driver 2200, a V display driver 2300, an H sensor read driver 2500 and a V sensor driver 2400.

The display area (sensor area) 2100 modulates the light from the backlight 1500 to emit the display light and picks up the image of the object in contact with or proximity to this area. The display area 2100 has liquid crystal elements serving as light-emitting elements (display elements) and light-receiving elements (imaging elements) arranged in a matrix form.

The H display driver 2200 line-sequentially drives the liquid crystal elements of the pixels in the display area 2100 together with the V display driver 2300, based on the display drive signal and the control clock supplied from the display drive circuit 1200.

The H sensor read driver 2500 line-sequentially drives the light-receiving elements of the pixels in the sensor area 2100 together with the V sensor driver 2400 to receive a light reception signal.

Figure 13:
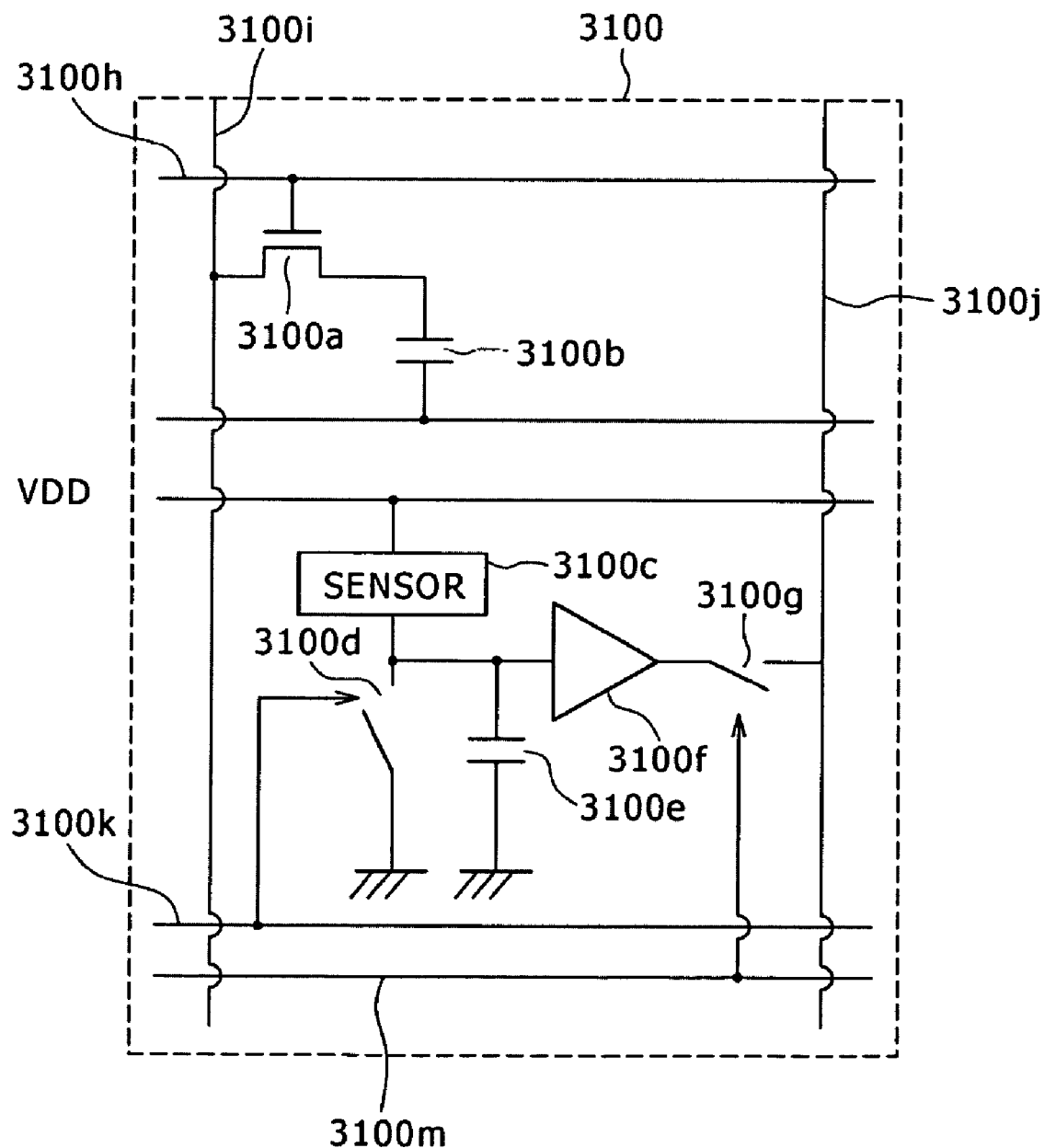
FIG. 13 is a circuit diagram illustrating a configuration example of a pixel.

Next, a detailed configuration example of each pixel in the display area 2100 will be described with reference to FIG. 13. A pixel 3100 shown in FIG. 13 includes a liquid crystal element serving as a display element and a light-receiving element.

More specifically, a switching element 3100a is provided on the side of the display element at the intersection between a gate electrode 3100h extending horizontally and a drain electrode 3100i extending vertically. The switching element 3100a includes, for example, a thin film transistor (TFT). A pixel electrode 3100b including liquid crystal is provided between the switching element 3100a and an opposed electrode. The switching element 3100a turns ON and OFF based on the drive signal supplied via a gate electrode 3100h. A pixel voltage is applied to the pixel electrode 3100b based on the display signal supplied via the drain electrode 3100i when the switching element 3100a is ON so that the display status is set up.

On the side of the light-receiving element adjacent to the display element, on the other hand, a light-receiving sensor 3100c is provided which includes, for example, a photodiode, and supplied with a power supply voltage VDD. Further, a reset switch 3100d and a capacitor 3100e are connected to the light-receiving sensor 3100c so that the same sensor 3100c is reset by the reset switch 3100d and so that the charge appropriate to the intensity of received light is stored in the capacitor 3100e. The stored charge is supplied to a signal output electrode 3100j via a buffer amplifier 3100f when a read switch 3100g turns ON. The stored charge is then output externally. On the other hand, the ON/OFF operation of the reset switch 3100d is controlled by a signal supplied from a reset electrode 3100k. The ON/OFF operation of the read switch 3100g is controlled by a signal supplied from a read control electrode 3100m.

Figure 14:
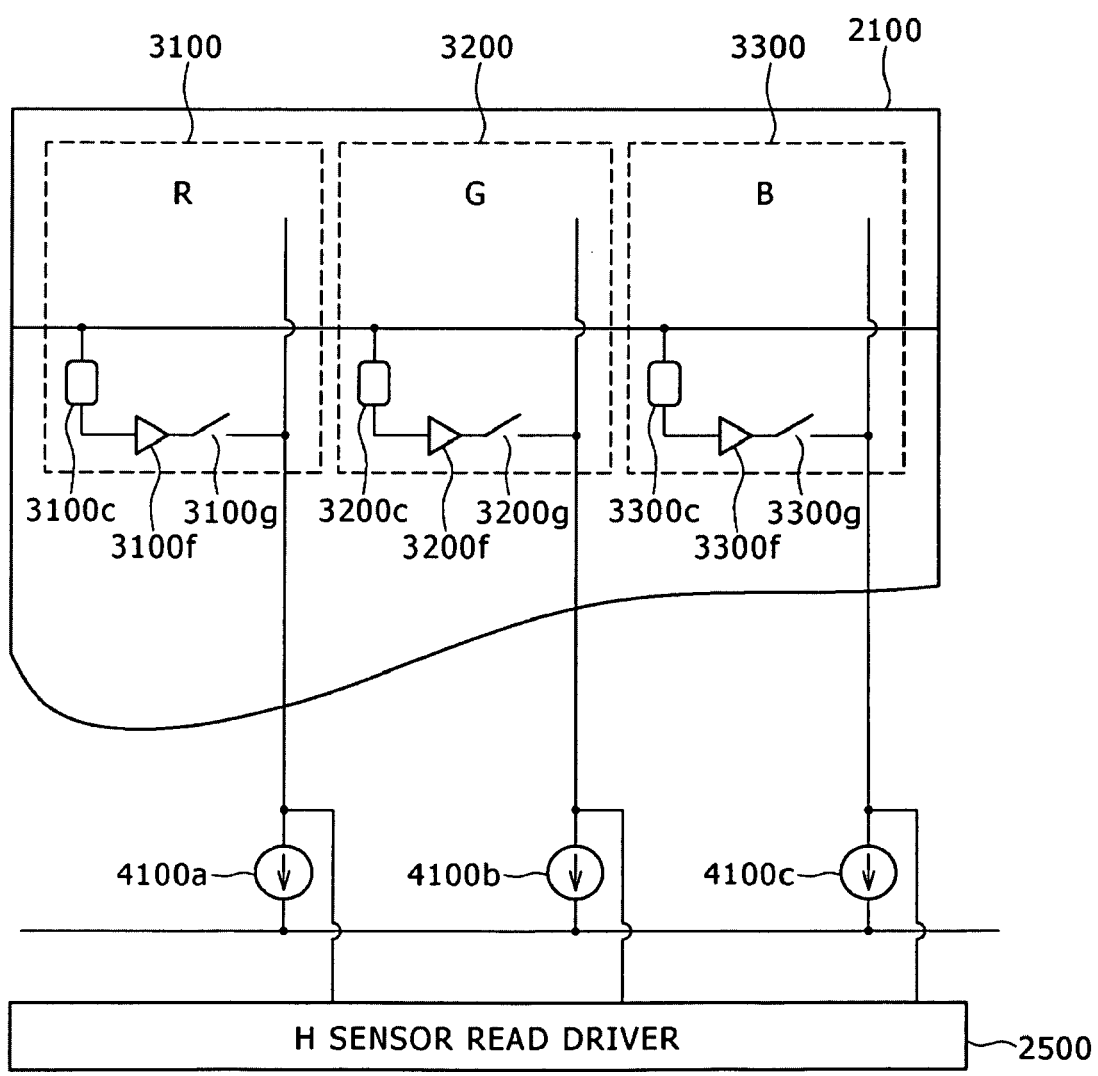
FIG. 14 is a circuit diagram used to describe the connection relationships between each pixel and a sensor reading horizontal driver.

Next, the connection relationship between each pixel in the display area 2100 and the H sensor read driver 2500 will be described with reference to FIG. 14. In the display area 2100, red (R), green (G) and blue (B) pixels 3100, 3200 and 3300 are arranged side by side.

The charge stored in the capacitors connected to each of light-receiving sensors 3100c, 3200c and 3300c of the respective pixels is amplified by buffer amplifiers 3100f, 3200f and 3300f of the respective pixels. The charge is then supplied to the H sensor read driver 2500 via signal output electrodes when read switches 3100g, 3200g and 3300g turn ON. It should be noted that one of constant current sources 4100a, 4100b and 4100c is connected to one of the signal output electrodes so that the H sensor read driver 2500 can detect, with high sensitivity, the signals appropriate to the received light intensities.

Next, the operation of the display/imaging device will be described in detail.

A description will be given first of the basic operations of the display/imaging device, namely, the operations of image displaying and object imaging.

In this display/imaging device, the display drive circuit 1200 generates a display drive signal based on the display data from the application program execution section 1100. The I/O display panel 2000 is line-sequentially driven with the drive signal to display an image. At this time, the backlight 1500 is also driven by the display drive circuit 1200 to light up and go out in synchronism with the I/O display panel 2000.

Figure 15:
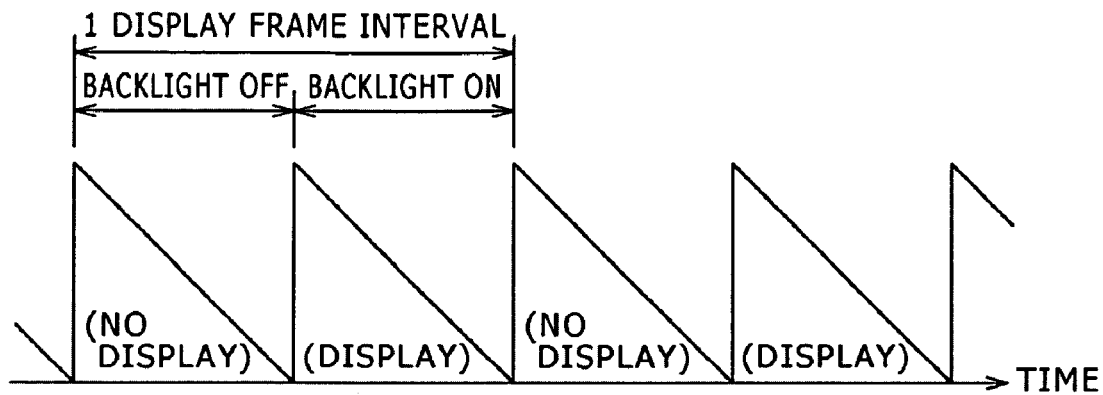
FIG. 15 is a timing diagram used to describe the relationship between the on/off status of a backlight and the display status.
Figure 16:
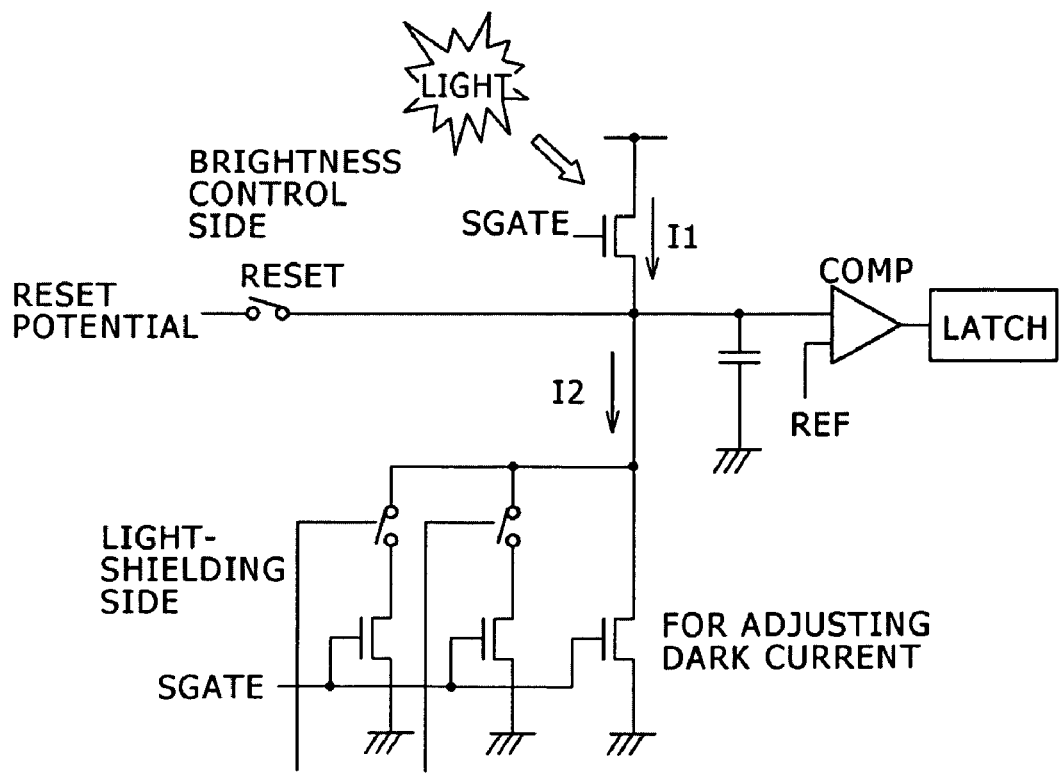
FIG. 16 is a diagram illustrating a known display device.

Here, a description will be given of the relationship between the ON/OFF status of the backlight 1500 and the display status of the I/O display panel 2000 with reference to FIG. 15.

First, if the image is displayed, for example, with a frame period of $1/60$ second, the backlight 1500 is unlit (OFF) during the first half of each frame interval ($1/120$ second) so that no image is displayed. During the second half of each frame interval, on the other hand, the backlight 1500 is lit (ON), and a display signal is supplied to each pixel so that the image of that frame interval is displayed.

As described above, the I/O display panel 2000 does not emit any display light during the first half of each frame interval. In contrast, the I/O display panel 2000 emits display light during the second half of each frame interval.

Here, if an object (e.g., tip of a finger) is in contact with or proximity to the I/O display panel 2000, the image of the object is picked up by the light-receiving element of each pixel in the I/O display panel 2000 as a result of line-sequential driving of the same panel 2000 by the light reception drive circuit 1300. The light reception signal from each light-receiving element is supplied to the light reception drive circuit 1300. The same circuit 1300 stores the light reception signals of the pixels of one frame and outputs the signals to the image processing section 1400 as a picked-up image.

The image processing section 1400 performs, based on the picked-up image, given image processing (calculations) to detect information (e.g., position coordinate data, shape and size of the object) about the object in contact with or proximity to the I/O display panel 2000.

It should be understood that various changes and modifications to the presently preferred embodiments described herein will be apparent to those skilled in the art. Such changes and modifications can be made without departing from the spirit and scope of the present subject matter and without diminishing its intended advantages. It is therefore intended that such changes and modifications be covered by the appended claims.

The invention is claimed as follows:

1. A display device comprising: first detection means for detecting a light intensity around a display area; second detection means for detecting a dark current when light is shielded; and a comparator for comparing a difference output between the first and second detection means against a given reference value, the display device controlling the light intensity supplied to the display area according to a comparison result of the comparator, wherein the first detection means or the second detection means have a plurality of detection elements connected in parallel so as to be selectable, a polarity signal adapted to select a polarity of the difference output and a reference value selection signal adapted to select a polarity of the given reference value are fed to the comparator, first and second choices are set by the selection of the plurality of detection elements making up the first detection means or the second detection means, the first choice translating into a smaller amount of dark current in the second detection means than in the first detection means, the second choice translating into a larger amount of dark current in the second detection means than in the first detection means, the polarity signal and the reference value selection signal are fed to the comparator so that the polarities of the difference output and the given reference value fed to the comparator are opposite between the first and second choices, and the plurality of detection elements making up the first or second detection means are selected, based on the comparison results of the comparator in the two polarities set for the first and second choices, so that the amount of dark current is the same in the first and second detection means.

2. A display control method for a display device including first detection means for detecting a light intensity around a display area, second detection means for detecting a dark current when light is shielded, and a comparator for comparing a difference output between the first and second detection means against a given reference value, the first or second detection means having a plurality of detection elements connected in parallel so as to be selectable, the display control method comprising the steps of: controlling the light intensity supplied to the display area according to a comparison result of the comparator; feeding a polarity signal adapted to select the polarity of the difference output and a reference value selection signal adapted to select a polarity of the given reference value to the comparator; setting first and second choices by the selection of a plurality of detection elements making up the first or second detection means, the first choice translating into a smaller amount of dark current in the second detection means than in the first detection means, the second choice translating into a larger amount of dark current in the second detection means than in the first detection means; feeding the polarity signal and the reference value selection signal to the comparator so that the polarities of the difference output and the given reference value fed to the comparator are opposite between the first and second choices; and selecting the plurality of detection elements making up the first or second detection means, based on the comparison results of the comparator in the two polarities set for the first and second choices, so that the amount of dark current is the same in the first and second detection means.

3. The display control method of claim 2, wherein if the comparison results of the comparator with the first and second choices are equal to each other, the plurality of detection elements making up the first or second detection means are selected so that an element size is closest to an average of first and second element sizes, the first element size determined by the selection of the plurality of detection elements making up the first or second detection means associated with the first choice, and the second element size determined by the selection thereof associated with the second choice, and the light intensity is controlled by the determined selection of the plurality of detection elements based on the comparison result of the difference output between the first and second detection means against the given reference value.

4. Electronic equipment having a display device in its enclosure, the display device comprising: first detection means for detecting a light intensity around a display area; second detection means for detecting a dark current when light is shielded; and a comparator for comparing a difference output between the first and second detection means against a given reference value, the display device controlling the light intensity supplied to the display area according to a comparison result of the comparator, wherein the first detection means or the second detection means have a plurality of detection elements connected in parallel so as to be selectable, a polarity signal adapted to select a polarity of the difference output and a reference value selection signal adapted to select a polarity of the given reference value are fed to the comparator, first and second choices are set by the selection of the plurality of detection elements making up the first detection means or the second detection means, the first choice translating into a smaller amount of dark current in the second detection means than in the first detection means, the second choice translating into a larger amount of dark current in the second detection means than in the first detection means, the polarity signal and the reference value selection signal are fed to the comparator so that the polarities of the difference output and the given reference value fed to the comparator are opposite between the first and second choices, and the plurality of detection elements making up the first or second detection means are selected, based on the comparison results of the comparator in the two polarities set for the first and second choices, so that the amount of dark current is the same in the first and second detection means.

* * * * *